United States Patent [19]

Umeda et al.

[11] 4,267,601
[45] May 12, 1981

[54] TUNING CONTROL APPARATUS FOR A FREQUENCY SYNTHESIZER TUNER

[75] Inventors: Kaoru Umeda, Kawasaki; Hideo Harada, Tokyo, both of Japan

[73] Assignee: Sony Corporation, Tokyo, Japan

[21] Appl. No.: 66,382

[22] Filed: Aug. 14, 1979

[30] Foreign Application Priority Data

Aug. 16, 1978 [JP] Japan ................... 53-99848
Aug. 16, 1978 [JP] Japan ................... 53-99849

[51] Int. Cl.³ .................... H04B 1/26; H03J 7/28
[52] U.S. Cl. .................... 455/165; 334/11; 455/173; 455/182; 455/183
[58] Field of Search ............ 334/11, 14–16; 331/1 A, 4, 25; 455/165, 166, 183, 173, 182

[56] References Cited
U.S. PATENT DOCUMENTS

| | | | |
|---|---|---|---|
| 3,803,494 | 4/1974 | Howell et al. | 455/183 X |
| 3,835,384 | 9/1974 | Liff | 455/183 X |
| 3,845,394 | 10/1974 | Hamada | 455/165 X |
| 3,864,637 | 2/1975 | Kanow | 455/165 |
| 3,961,267 | 6/1976 | Weissmuller, Jr. | 455/166 |
| 4,008,436 | 2/1977 | Fujita | 455/165 |
| 4,088,959 | 5/1978 | Sumi | 455/183 X |

Primary Examiner—Paul L. Gensler
Attorney, Agent, or Firm—Lewis H. Eslinger; Alvin Sinderbrand

[57] ABSTRACT

Tuning control apparatus is provided for use with a frequency synthesizer tuner of the type having a phase-locked loop including a reference oscillator, a variable frequency oscillator to produce a local oscillating signal, a programmable frequency divider coupled to the variable frequency oscillator for dividing the frequency of the local oscillating signal by a variable dividing ratio to produce a frequency-divided oscillating signal, a phase comparator for comparing the frequency-divided oscillating signal to the output of the reference oscillator to produce an error signal, and a feedback circuit for feeding back the error signal from the phase comparator to the variable frequency oscillator to adjust the frequency of the local oscillating signal and thereby establish a tuning condition of the tuner. The tuning control apparatus includes a counter for counting control pulses supplied thereto, the count of this counter determining the dividing ratio of the programmable frequency divider. A control pulse generator supplies control pulses to the counter. An adjusting circuit is operable to adjust the rate at which the control pulses are supplied to the counter for adjusting the speed at which the count of the counter and the dividing ratio of the programmable frequency divider changes. In one embodiment of this invention, a switching circuit is provided to be selectively operable to supply only a predetermined number of the control pulses to the counter so as to change the count of the latter, and thus the dividing ratio of the programmable frequency divider, by a predetermined step. Thus, the tuning condition of the frequency synthesizer tuner can be changed at a variable rate or, alternatively, in a stepwise manner.

23 Claims, 14 Drawing Figures

S1

S2

S3

S4

S1

S5

S6

S7

S8

S9

S10

TUNING CONTROL APPARATUS FOR A FREQUENCY SYNTHESIZER TUNER

BACKGROUND OF THE INVENTION

This invention relates to tuning control apparatus for a frequency synthesizer tuner and, more particularly, to such tuning control apparatus wherein the tuning condition of the frequency synthesizer tuner can be changed at a variable rate or, alternatively, the tuning condition can be changed in an incremental step-wise manner under the control of an operator.

In a typical tuner, such as a tuner for receiving broadcasted radio or television signals which are transmitted over respective broadcast frequencies, the tuning condition of the tuner is determined by the frequency of the local oscillating signal which is mixed with the received broadcast frequencies to produce an intermediate frequency (IF) signal. The carrier frequency of the IF signal is constrained within a narrow range which is a function of the mixing of the broadcast frequency and the local oscillating frequency. As the local oscillating frequency is changed, the tuner is tuned to different broadcast frequencies to receive the program information which is broadcasted thereover. Typically, a local oscillator may include a manually adjustable capacitor which, when the capacitance value thereof varies, the local oscillating frequency correspondingly varies. By adjusting the tuning knob which is mechanically coupled to the variable capacitor, an operator may change the local oscillating frequency as desired and, thus, may establish any desired tuning condition of the tuner. Recently, the variable capacitor has been constructed as a variable capacitance diode whose capacitance value is determined by a control voltage applied thereto. Since the same control voltage will result in the same tuning condition, tuners are known wherein digital techniques are relied upon for storing digital representations of respective control voltages, which digital representations can be retrieved, as desired, so as to establish a capacitance value rapidly which would tune the tuner to a desired broadcast frequency.

More recently, a so-called frequency synthesizer tuner has been proposed, in which the local oscillating signal is generated by a phase-locked loop under the control of a digital frequency-selecting signal. In such a phase-locked loop, a variable frequency oscillator produces the local oscillating signal. In addition to being supplied to the usual mixer in the tuner, the local oscillating signal is supplied through a programmable frequency divider to a phase comparator whereat it is compared to a reference oscillating signal. Any phase difference therebetween results in an error signal which is fed back to the variable frequency oscillator so as to adjust the frequency of the local oscillating signal and thereby adjust the tuning condition of the tuner. If the dividing ratio of the frequency divider changes, the frequency-divided oscillating signal which is supplied to the phase comparator will change. By well-known phase-locked loop operation, this changes the basic frequency of the local oscillating signal, resulting in cancelling the phase error signal. Thus, the tuning condition of the tuner is established merely by setting a desired frequency dividing ratio of the programmable frequency divider.

In the aforementioned frequency synthesizer tuner, the dividing ratio of the programmable frequency divider may be established by a counter, such as an UP/DOWN counter whose count sets the dividing ratio. As the count of this UP/DOWN counter is incremented, the dividing ratio increases and, conversely, as the count of the UP/DOWN counter is decremented, the dividing ratio correspondingly decreases. This features can be used, advantageously, to effect a so-called scanning operation, whereby the tuning condition of the tuner is scanned either in the upward or downward direction from one broadcast frequency to the next. Such a scanning operation may be helpful to the operator to enable him to ascertain the program information which is available on the various broadcast frequencies which can be received by his tuner. This scanning operation may be of the automatic scanning type, referred to herein as the auto-scan mode, in which the count of the UP/DOWN counter is incremented or decremented periodically at a fixed rate, whereupon the frequency of the local oscillating signal is increased or decreased at this same rate. One disadvantage of such an auto-scan mode is that the rate at which the tuning condition of the tuner is changed is fixed. In many instances, this fixed rate may be too slow for the user. However, heretofore, it has not been possible for the user to change the auto-scan rate.

In addition to the auto-scan mode, it may be desirable to change the tuning condition of the tuner on a step-wise basis. That is, although the auto-scan rate may, in many instances, be too slow, in other instances the auto-scan rate may be too fast. In view of the latter disadvantage, it is desirable to change the tuning condition by an incremental amount (for example, by 0.1 MHz for an FM tuner and by 1 KHz for an AM tuner) in response to each manual operation by the user.

OBJECTS OF THE INVENTION

Therefore, it is an object of the present invention to provide imprivoved tuning control apparatus which overcomes the aforenoted problems attending prior art tuners and, particularly, prior art frequency synthesizer tuners.

Another object of this invention is to provide tuning control apparatus in which an auto-scan operation can be carried out at a scanning rate that is controlled by the user.

A further object of this invention is to provide tuning control apparatus in which the tuning condition of the tuner can be changed (i.e., incremented or decremented) on a step-wise basis in response to each manual operation by the user.

An additional object of this invention is to provide a tuner in which the tuning condition can be changed at a rate controllable by the user or, alternatively, can be changed in a step-wise manner by incrementally changing the frequency of the local oscillating signal of that tuner.

Various other objects, advantages and features of the present invention will become readily apparent from the ensuing detailed description, and the novel features will be particularly pointed out in the appended claims.

SUMMARY OF THE INVENTION

In accordance with the present invention, tuning control apparatus is provided for use with a frequency synthesizer tuner of the type having a phase-locked loop including a reference oscillator, a variable frequency oscillator to produce a local oscillating signal, a programmable frequency divider coupled to the variable frequency oscillator for dividing the frequency of the local oscillating signal by a variable dividing ratio to produce a frequency-divided oscillating signal, a phase comparator for comparing the frequency-divided oscillating signal to the output of the reference oscillator to produce an error signal, and a feedback circuit for feeding back the error signal to the variable frequency oscillator to adjust the frequency of the local oscillating signal and thereby establish a tuning condition of the tuner. The tuning control apparatus comprises a counter for counting control pulses supplied thereto, the count of the counter determining the dividing ratio of the programmable frequency divider, and a control pulse generator for supplying control pulses to the counter. An adjusting circuit is operable to adjust the rate at which the control pulses are supplied to the counter so as to adjust the speed at which the count of the counter, and thus the dividing ratio of the programmable frequency divider, changes. In another embodiment of the present invention, a switching circuit is selectively operable to supply only a predetermined number of the control pulses to the counter to change the count of the counter, and thereby change the dividing ratio of the programmable frequency divider, in a step-wise manner. As an example of this latter embodiment, only a single control pulses is supplied to change the count of the counter. The switching circuit must be operated once again in order to supply another control pulse to the counter.

In accordance with an aspect of this invention, a manually operable switching device is provided for effecting both a variable rate at which the tuning condition of the tuner is changed, and a step-wise change in the tuning condition.

BRIEF DESCRIPTION OF THE DRAWINGS

The following detailed description, given by way of example, will best be understood in conjunction with the accompanying drawings in which.

DETAILED DESCRIPTION OF A PREFERRED EMBODIMENT

Figure 1:
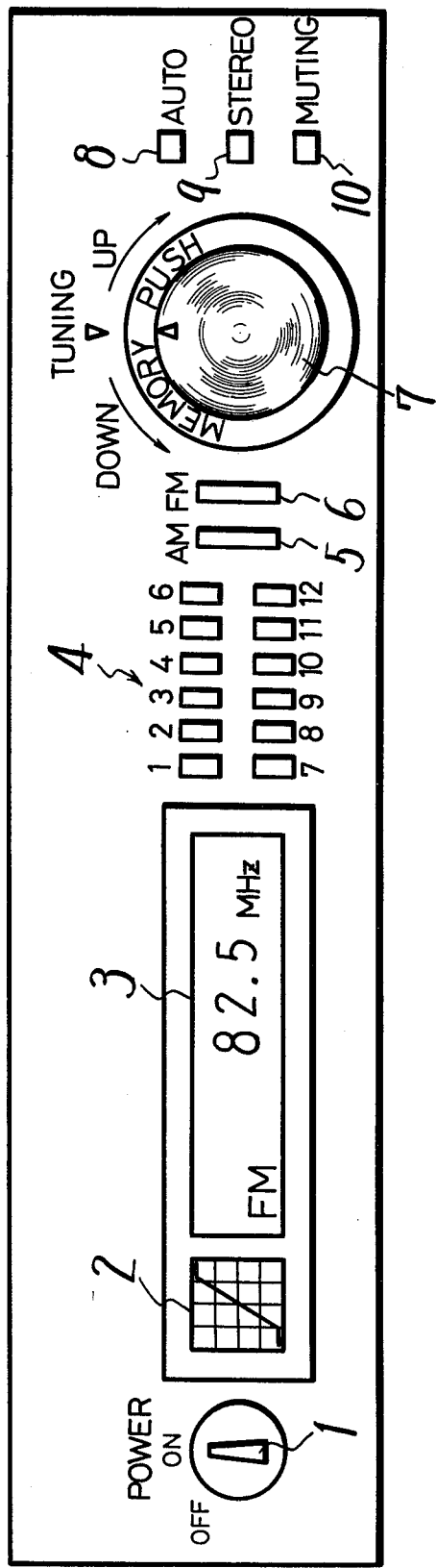
FIG. 1 is a front view of a control panel which can be used in the frequency synthesizer tuner in which the present invention finds ready application.

Referring now to the drawings, the present invention will be described in the environment of an AM/FM radio tuner of the type which is adapted to be tuned to broadcast AM frequencies and also to braodcast FM frequencies. The present invention also can be used in the tuning section of a television receiver so as to tune the tuning section to a broadcast channel. It is appreciated that, when the tuner with which the present invention is used is tuned to a broadcast frequency, or channel, the program information which is transmitted by that frequency, or channel, will be received. As is conventional in AM broadcast transmissions, the broadcast frequencies are on the order of hundreds of kilohertz, with, for all practical purposes, the least significant digit of the broadcast frequency being equal to 1 KHz. Also, and as is conventional for FM broadcast transmissions, the broadcast frequencies are on the order of 80 to 110 MHz, with the least significant digit, for all practical purposes, being equal to 0.1 MHz. The significance of this will become readily apparent from the detailed description below.

FIG. 1 illustrates a control panel for an AM/FM tuner with which the present invention can be used. The various elements of this control panel include a power switch 1, a signal level meter 2 which provides a visual indication of the strength of the signal being received and, thus, a representation of the tuning condition of the tuner relative to the broadcast frequency, and a digital frequency indicator 3. The frequency indicator provides visual indications of whether the tuner is operated in its AM or FM receiving mode, and also the particular frequency to which the tuner is tuned, irrespective of whether that frequency coincides with a broadcast frequency. In the illustrated example, frequency indicator 3 represents that the tuner is operated in its FM mode and, moreover, is tuned to a frequency of 82.5 MHz, with the least significant digit of this frequency being in terms of tenths of megahertz.

The control panel also is provided with the set of pushbutton switches 4, this set being illustrated as twelve such switches (1, 2, . . . 12) which are adapted to be preset by the user to twelve respective broadcast frequencies. This allows the user to preset, or program, the tuner to desired broadcast frequencies and to tune the tuner rapidly to any one of such preset broadcast frequencies merely by operating a selected pushbutton switch. Examples of tuners, and particularly frequency synthesizer tuners, having such preset pushbutton switches are known to the prior art and, in the interest of brevity, are not described further herein. In addition to pushbutton switches 4, the illustrated control panel includes an AM selector switch 5 and an FM selector switch 6. Depending upon which of these selector switches 5, 6 is operated by the user, the tuner is tunable either in the AM broadcast band or in the FM broadcast band.

Also shown on the control panel of the tuner is a rotary tuning knob 7 which is movable in both the clockwise and counterclockwise directions for the purpose of changing the tuning condition of the tuner either in the upward direction, that is, the broadcast frequencies to which the tuner is tuned are increased, or in the downward direction, that is, the broadcast frequencies to which the tuner is tuned are decreased. Tuning knob 7 is described in greater detail below as being selectively operable to change the least significant digit of the frequency to which the tuner is tuned on a step-wise basis with each operation of the knob, or to change the tuning condition of the tuner so as to scan the broadcast frequencies at a rate determined by the angular displacement of the tuning knob. A spring (not shown) exerts a bias force on tuning knob 7 so as to bias it to its neutral, or center position. If the tuning knob is rotated by less than +10° or −10° from this center position, no change in the tuning condition of the tuner occurs. However, if the tuning knob is rotated by more than +10° but less than +20°, or by more than −10° but less than −20° from the center position, the frequency to which the tuner is tuned will be increased or decreased, respectively, by the least significant digit. This means that, for the operation of the tuner in its AM mode, the tuning condition is increased or decreased by 1 KHz. Similarly, when the tuner is operated in its FM mode, its tuning condition is increased or decreased by 0.1 MHz. To obtain a further change in the tuning condition of the tuner, it is necessary for the user to return the tuning knob to its center position and then, once again, rotate it between 10° and 20° in the clockwise or counterclockwise direction. If tuning knob 7 is rotated by more than +20°, and up to a maximum of +60°, or by more than −20° and up to a maximum of −60°, the tuning condition of the tuner automatically is changed in the upward or downward direction, and at a rate which is determined by the angular rotation of the tuning knob. This is the so-called auto-scan mode whereby the tuner scans the AM or FM broadcast spectrum by varying the tuning condition of the tuner in successive steps of 1 KHz or 0.1 MHz. This auto-scan operation is terminated by returning tuning knob 7 to its center position. The tuner then will retain its last-attained tuning condition which was assumed during the auto-scan operation.

FIG. 1 also illustrates the presence of an automatic sweep switch 8, a stereo selector switch 9 and a muting selector switch 10. The stereo and muting selector switches perform conventional operations wherein stereophonic program information can be received and suitably demodulated, decoded and reproduced; and a sound-muting operation can be carried out. Since these operations are conventional, further discussion thereof is not provided. When automatic sweep switch 8 is actuated, tuning knob 7 may be rotated to effect an auto-scan operation whereby the frequency to which the tuner is tuned either is increased or decreased in incremental successive steps until a broadcast frequency is received. This reception of a broadcast frequency may be ascertained from the IF section, as is conventional. When the broadcast frequency is received, the auto-scan operation is interrupted, and the tuning condition of the tuner remains set to this broadcast frequency. Thus, the operation of automatic sweep switch 8 cooperates with the operation of tuning knob 7 to effect a rapid scan of the tuner from one broadcast frequency to another.

Although forming no part of the present invention per se, it is mentioned herein that tuning knob 7 may be operated in a manner whereby a particular tuning condition of the tuner may be stored, or "memorized". In this regard, the tuner may be provided with an addressable memory device having a number of addressable storage locations in which digital representations corresponding to respective tuning conditions, i.e., numerical representations of the broadcast frequencies to which the tuner may be tuned, can be stored. When the tuner is tuned to a desired broadcast frequency, the digital representation of that frequency may be stored in a particular storage location of the memory device by depressing tuning knob 7, which, for example, actuates the memory write-in circuit, and also by depressing one of pushbutton switches 4, which addresses a corresponding storage location into which the digital representation is written. To retrieve this stored digital representation, and thus tune the tuner to the corresponding broadcast frequency, the associated pushbutton switch merely is actuated to read out the stored digital representation. This digital representation is used to establish a frequency of the local oscillating signal in the tuner such that the desired tuning condition is obtained.

Figure 2:
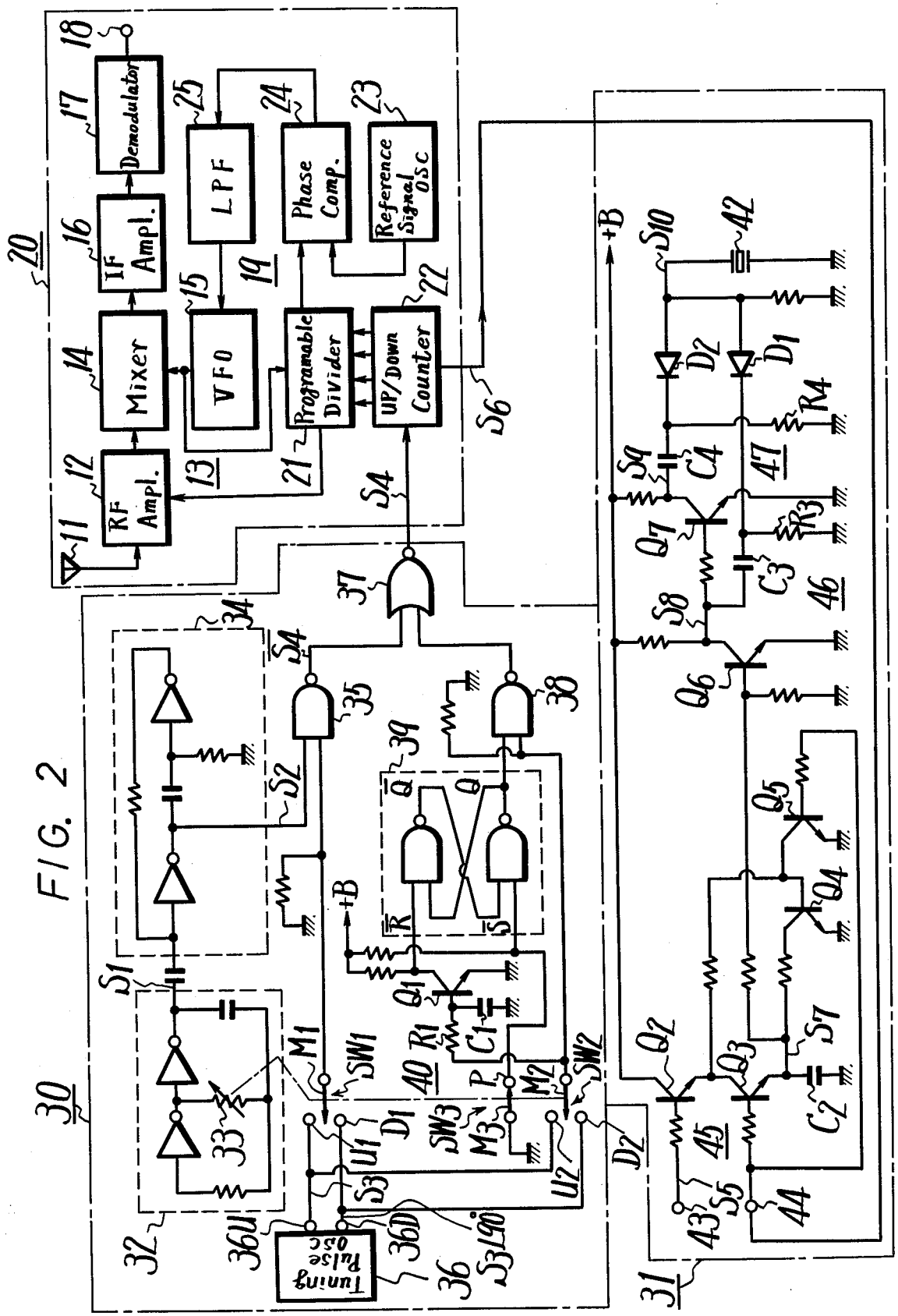
FIG. 2 is a partial block, partial schematic diagram of one embodiment of the present invention.

Referring now to FIG. 2, there is illustrated a partial block, partial schematic diagram of one embodiment of the present invention. FIG. 2 illustrates a frequency synthesizer tuner 20 connected to tuning control apparatus 30 and also to a circuit 31 for indicating when the tuning condition of tuner 20 changes. Frequency synthesizer tuner 20 is comprised of an RF amplifier stage 12, a frequency converter 13, a demodulator 17 and a phase-locked loop 19. RF amplifier 12 is coupled to an antenna 11, or other input supply circuit for supplying broadcast frequencies to the RF amplifier. The output of RF amplifier 12 is supplied to frequency converter 13 which is adapted to select a particular one of the received broadcast frequencies, and convert the information-modulated broadcast frequency to a modulated IF frequency for demodulation by demodulator 17. In this regard, frequency converter 13 is conventional and is comprised of a mixer 14 supplied with the RF signal and a local oscillating signal, the frequency of the latter being determinative of the particular RF signal which is frequency-converted, and thus determinative of the tuning condition of frequency synthesizer tuner 20. IF amplifer 16 amplifies the IF signal and supplies same to demodulator 17 whereat the program information which had been modulated onto the original broadcast frequency is recovered and supplied to output terminal 18.

The local oscillating signal supplied to mixer 14 is generated by phase-locked loop 19 and, more particularly, by variable frequency oscillator 15 included in this phase-locked loop. The phase-locked loop additionally includes a programmable frequency divider 21, a reference oscillator 23 and a phase comparator 24. Variable frequency oscillator 15, which may comprise a voltage-controlled oscillator (VCO) generates the local oscillating signal which is supplied to mixer 14 and, additionally, is supplied through programmable frequency divider 21 to phase comparator 24. The programmable frequency divider is adapted to divide the frequency of the local oscillating signal by a variable dividing ratio. As an example, the programmable divider may comprise a presettable counter whose count is preset to a desired ratio. The frequency-divided oscillating signal produced by programmable frequency divider 21 is determined by the frequency of the local oscillating signal and the preset dividing ratio of the programmable frequency divider. Typical programmable frequency dividers are known to the prior art and, therefore, need not be further described herein.

Phase comparator 24 also is supplied with a reference oscillating signal generated by reference oscillator 23. Preferably, the reference oscillator is a precise crystal oscillator for generating a reference signal of predetermined, precise frequency and phase. Any phase differential between the frequency-divided oscillating signal supplied to phase comparator 24 from variable frequency oscillator 15 and programmable frequency divider 21 and the reference oscillating signal results in an error signal. This error signal is fed back as a DC control voltage via low pass filter 25 to vary the frequency of the local oscillating signal generated by variable oscillator 15. As is conventional in a phase-locked loop, the frequency of the local oscillating signal is adjusted such that the frequency-divided oscillating signal and the reference oscillating signal are in frequency and phase-coincidence. When this occurs, the local oscillating signal remains substantially fixed and thus determines the tuning condition of frequency synthesizer tuner 20.

The dividing ratio to which programmable divider 21 is preset is determined by a counter 22 connected to the programmable divider. As one example thereof, counter 22 may comprise an UP/DOWN counter whose count is supplied to programmable divider 21 so as to establish the particular dividing ratio of the latter. As the count of UP/DOWN counter 22 changes, the dividing ratio of programmable divider 21 correspondingly changes. This, in turn, changes the frequency of the frequency-divided oscillating signal supplied to phase comparator 24. As a result thereof, the phase comparator feeds back an error signal to variable frequency oscillator 15 so as to corespondingly change the frequency of the local oscillating signal that is supplied to mixer 14. Thus, it is seen that, by controlling the count of UP/DOWN counter 22, the dividing ratio of programmable frequency divider 21 is controlled which, in turn, determines the tuning condition of the frequency synthesizer tuner.

In one embodiment of this invention, the count of UP/DOWN counter 22 which is used to preset the dividing ratio of programmable frequency divider 21 is a digital representation of a numerical frequency value in BCD form. Each digit of this BCD representation is represented as a 4-bit parallel signal, and each 4-bit signal is supplied, in sequence,, from the UP/DOWN counter to the programmable frequency divider. For example, if frequency synthesizer tuner 20 is operated in its FM mode, the count of UP/DOWN counter 22 will represent, in BCD form, the hundreds, tens, units and tenths of megahertz of the FM broadcast frequency to which the tuner is to be tuned. If, as shown in FIG. 1, the broadcast frequency of 82.5 MHz is to be received, UP/DOWN counter 22 supplies programmable frequency divider 21 with the BCD representation of 0.5 MHz, the least significant digit of the desired broadcast frequency, followed by the BCD representation of 2 MHz, followed by the BCD representation of 80 MHz. The actual BCD representations which are supplied to the programmable frequency divider are, in order, 5, 2 and 8. Based upon this BCD representation of 82.5 MHz, programmable frequency divider 21 is preset to a dividing ratio, whereupon the frequency of the oscillating signal generated by variable frequency oscillator 15 is divided to result in an error signal fed back to the variable frequency oscillator by phase comparator 24, thereby establishing the tuning condition of frequency synthesizer tuner 20 to this broadcast frequency of 82.5 MHz.

Tuning control apparatus 30 is connected to UP/DOWN counter 22 for the purpose of changing the count of this counter in an upward or downward direction so as to correspondingly change the tuning condition of the frequency synthesizer tuner. The tuning control apparatus is comprised of a pulse oscillator 36, a gate circuit 35, an astable multivibrator 32, a monostable multivibrator 34, a gate circuit 38, a flip-flop circuit 39 and manually operable switches $SW_1$, $SW_2$ and $SW_3$. Pulse oscillator 36 may be supplied with clock pulses to generate first and second trains of control pulses at respective output terminals 36U and 36D thereof. Alternatively, the pulse oscillator may comprise a stable oscillating circuit, such as a crystal oscillator, for supplying these trains of pulses at its output terminals. The control pulses provided at output terminal 36D are in phase quadrature with respect to the control pulses provided at output terminal 36U. That is, the phase difference between the respective control pulses provided at these output pulses is 90°. Switch $SW_1$ is provided with a movable contact $M_1$ which is selectively engageable with either fixed contact $U_1$ or fixed contact $D_1$. These fixed contacts $U_1$ and $D_1$ are connected to output terminals 36U and 36D, respectively, of pulse oscillator 36. Movable contact $M_1$ is further connected to an input of gate circuit 35. Preferably, this gate circuit is a NAND gate.

Astable multivibrator 32, shown herein in one embodiment thereof, is provided with an adjustable element 33, such as an adjustable resistor. The frequency, and thus the period, of the oscillating pulse signal generated by astable multivibrator 32, is adjustable by suitable adjustment of variable resistor 33. The output of astable multivibrator 32 is connected to monostable multivibrator 34, one embodiment of which is particularly illustrated. The monostable multivibrator is adapted to generate pulses of predetermined duration in response to the leading edge of each pulse signal supplied thereto by the astable multivibrator. It is appreciated that, as the frequency, and thus the period, of the pulse signals produced by astable multivibrator 32 is varied, the frequency, and thus the period, of the constant duration pulses produced by monostable multivibrator 34 varies in a corresponding manner. These constant duration pulses produced by the monostable multivibrator are supplied to the other input of NAND gate 35. The output of this NAND gate is connected to the pulse input of UP/DOWN counter 22 via a NOR circuit 37. The count of the UP/DOWN counter is incremented or decremented in response to each control pulse which is passed thereto by NAND gate 35 and NOR circuit 37. The direction in which UP/DOWN counter 22 counts these control pulses is determined by the phase of the control pulses which are supplied. Thus, if switch $SW_1$ is operated such that movable contact $M_1$ engages fixed contact $U_1$, the control pulses which are produced at output terminal 36U of pulse' oscillator 36 are supplied to UP/DOWN counter 22 to increment the count. Conversely, if switch $SW_1$ is operated such that its movable contact $M_1$ is in engagement with fixed contact $D_1$, the quadrature-related pulse signals produced at output terminal 36D of pulse oscillator 36 are supplied to UP/DOWN counter 22 to decrement the count thereof. As an example, clock signals (not shown) synchronized with the pulse signals produced at output terminal 36U, referred to herein as the count-up control pulse signals, may be used to clock, or gate, such count-up control pulses to a count-up input of the counter. Quadrature-related clock pulses, synchronized with the pulse signals produced at output terminal 36D, referred to as the count-down control pulse signals, may be used to clock or gate, the count-down control pulses to a count-down input of the UP/DOWN counter. Thus, the counting direction of UP/DOWN counter 22 is determined as a function of whether count-up or count-down control pulses are supplied thereto.

Switch $SW_2$ is similar to switch $SW_1$ and includes a movable contact $M_2$ selectively engageable either with fixed contact $U_2$ or fixed contact $D_2$. These fixed contacts $U_2$ and $D_2$ are connected to output terminals 36U and 36D, respectively, of pulse oscillator 36 to receive the count-up and count-down pulse signals, respectively. Movable contact $M_2$ is connected to one input of gate circuit 38, shown herein as a NAND gate.

Flip-flop circuit 39 is shown as being comprised of cross-coupled NAND gates having inputs $\bar{S}$ and $\bar{R}$ for receiving set and reset signals of relatively lower potential, such as ground potential, to set or reset the flip-flop circuit. Flip-flop circuit 39 additionally includes an output Q connected to another input of NAND gate 38. The set input $\bar{S}$ is connected to switch $SW_3$ having a movable contact $M_3$ selectively engageable with a fixed contact P to supply ground potential thereto. Thus, when switch $SW_3$ is closed, that is, when movable contact $M_3$ engages fixed contact P, ground potential is supplied to set input $\bar{S}$, thereby setting flip-flop circuit 39 to its first state to supply a conditioning signal of a relatively higher potential to NAND gate 38. The reset input $\bar{R}$ is connected to movable contact $M_2$ of switch $SW_2$ via a delay circuit 40. The delay circuit is shown as comprising a resistor $R_1$ connected in series with a capacitor $C_1$ in the form of an integrating circuit. An inverting transistor $Q_1$ is connected between the reset input $\bar{R}$ of flip-flop circuit 39 and the junction defined by resistor $R_1$ and capacitor $C_1$. It will be seen that when switch $SW_2$ is operated to engage movable contact $M_2$ with either of its fixed contacts $U_2$ and $D_2$, a count-up or count-down control pulse signal is supplied by switch $SW_2$ to charge capacitor $C_1$. After a predetermined delay, capacitor $C_1$ is sufficiently charged to render transistor $Q_1$ conductive. This, in turn, supplies a relatively low potential to the reset input $\bar{R}$ of flip-flop circuit 39 to reset this flip-flop circuit to its second state, resulting in an inhibit signal of relatively low potential supplied to NAND gate 38. The output of NAND gate 38 is connected to NOR circuit 37 so as to supply the count-up and count-down pulses to the count-up or count-down input of UP/DOWN counter 22.

Figure 3:
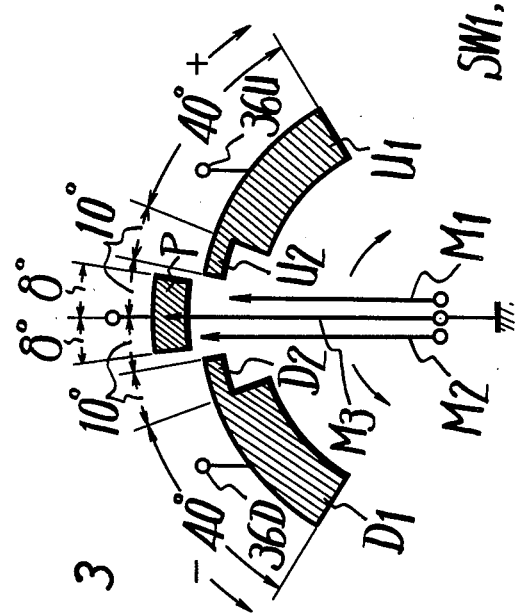
FIG. 3 is a schematic diagram of the switching device which can be used with the present invention.

Before describing the operation of the tuning control apparatus which has been thus far described, reference is made to FIG. 3 which is a schematic representation of tuning control knob 7 (FIG. 1) comprised of switches $SW_1$, $SW_2$, and $SW_3$. Fixed contact P of switch $SW_3$ is a conductive element that is substantially arcuate shaped and subtends an angle of 16°. Movable contact $M_3$ is supplied with ground potential and, when tuning knob 7 is at its center or neutral position, this movable contact engages fixed contact P. Movable contact $M_3$ remains in engagement with fixed contact P when knob 7 is rotated from its center position within the range ±8°. Beyond this range, movable contact $M_3$ is disengaged from fixed contact P, thus removing ground potential from the fixed contact.

Fixed contacts $U_2$ and $D_2$ each are arcuate shaped, and each subtends an angle of 10°. The leading edge of each of these fixed contacts is spaced from the trailing edge of fixed contact P by 2°. Movable contact $M_2$ is ganged for simultaneous operation with the movement of movable contact $M_3$. If these movable contacts are in alignment with each other, it is appreciated that if tuning knob 7 is rotated in, for example, the clockwise direction by more than 8°, movable contact $M_3$ disengages fixed contact P, and movable contact $M_2$ does not engage fixed contact $U_2$ until this clockwise rotation of the tuning knob is equal to 10°. The same holds true for a counterclockwise rotation of tuning knob 7.

Fixed contacts $U_1$ and $D_1$ of switch $SW_1$ are arcuate shaped, and the leading edge of each is spaced from the center position of tuning knob 7 by 20°. Furthermore, each of these fixed contacts subtends an angle of 40°. Movable contact $M_1$ is ganged for simultaneous operation with movable contacts $M_2$ and $M_3$. Thus, it is appreciated that movable contact $M_1$ does not engage its fixed contact $U_1$ until tuning knob 7 is rotated in the clockwise direction by at least 20°. Similarly, movable contact $M_1$ does not engage its fixed contact $D_1$ until knob 7 is rotated in the counterclockwise direction by at least 20°.

In the illustrated embodiment, fixed contacts $U_1$ and $U_2$ are of integral construction and are connected to output terminal 36U of pulse oscillator 36. Similarlarly, fixed contacts $D_1$ and $D_2$ are integrally constructed and are electrically connected to output terminal 36D of the pulse oscillator. All of the fixed contacts may be positioned in the same plane, such as the plane of the paper of the drawings, and may be disposed at different radial locations from the axis of rotation of tuning knob 7. Consistent with this embodiment, the movable contacts $M_1$–$M_3$ may be of different lengths such that each movable contact engages only the fixed contact(s) associated therewith. Alternatively, the fixed contacts may be located in different planes, such as in a stacked configuration, and the respective movable contacts may be disposed in the particular plane with which its fixed contact(s) is located.

To summarize the operation of switches $SW_1$–$SW_3$ of tuning knob 7, as shown in FIG. 3, it is seen that when the tuning knob is in its center, or neutral position, only movable contact $M_3$ engages fixed contact P. When the tuning knob is rotated in the clockwise or counterclockwise direction by more than 8°, movable contact $M_3$ disengages fixed contact P. When this rotation of the tuning knob is equal to 10°, movable contact $M_2$ now engages its fixed contact $U_2$ or $D_2$, depending upon the rotation of the tuning knob. As the rotation of the tuning knob continues, movable contact $M_1$ engages its fixed contact $U_1$ or $D_1$ once this rotation exceeds 20°. Although movable contact $M_2$ engages its fixed contact $U_2$ or $D_2$ at the same time that movable contact $M_1$ engages its fixed contact $U_1$ or $D_1$, this has no effect upon the operation of the tuning control apparatus, as will now be described.

Returning to FIG. 2, let it be assumed that tuning knob 7 is in its center position. Consequently, switch $SW_3$ is operated such that movable contact $M_3$ engages fixed contact P to supply ground potential thereto. This ground potential is coupled to the set input $\bar{S}$ of flip-flop circuit 39 to set the flip-flop circuit to its first state. Hence, an enabling or conditioning signal is applied to NAND gate 38. However, switch $SW_2$ remains in its inoperative position, that is, movable contact $M_2$ is disengaged from either of its fixed contacts $U_2$ and $D_2$. This means that the count-up and count-down pulses, which normally are supplied to fixed contacts $U_2$ and $D_2$ by pulse oscillator 36, are not applied to NAND gate 38.

Let it now be assumed that tuning knob 7 is rotated in the clockwise direction by more than 10°, but less than 20°. Consequently, switch $SW_2$ assumes its operative position to engage movable contact $M_2$ with fixed contact $U_2$. Switch $SW_2$ now applies a count-up pulse to conditioned NAND gate 38, and this NAND gate passes the count-up pulse through NOR circuit 37 to the count-up input of UP/DOWN counter 22. The count of this UP/DOWN counter is incremented; and the dividing ratio of programmable frequency divider 21 is correspondingly changed. As described hereinabove, this change in the dividing ratio results in a change in the tuning condition of frequency synthesizer tuner 20.

When movable contact $M_2$ engages its fixed contact $U_2$, the control pulse signal which is provided at the movable contact also is supplied to delay circuit 40. After a suitable time delay, determined by the resistance and capacitance of resistor $R_1$ and capacitor $C_1$, transistor $Q_1$ is rendered conductive to supply a reset signal to reset input $\overline{R}$ of flip-flop circuit 39. The flip-flop circuit is reset to its second state to supply an inhibit signal to NAND gate 38. Thus, only a predetermined number of control pulses are passed by the NAND gate to UP/DOWN counter 22, the number of such control pulses being determined by the time constant of delay circuit 40. As one example thereof, this time constant may be selected such that only a single control pulse is supplied to the UP/DOWN counter when switch $SW_2$ is moved to its operative position. It is, of course, recognized, that when switch $SW_2$ is in its operative position, switch $SW_3$ is in its inoperative position to remove ground potential from the set input S of flip-flop circuit 39.

If the user wishes to change further the tuning condition of frequency synthesizer tuner 20, tuning knob 7 is returned to its center position. This moves switch $SW_2$ to its inoperative position and switch $SW_3$ to its operative position, resulting in setting flip-flop circuit 39 to its first state, and condition NAND gate 38 to pass another control pulse which subsequently may be supplied thereto by switch $SW_2$. When tuning knob 7 is angularly rotated once again by more than 10° but less than 20°, a control pulse is supplied to NAND gate 38 by switch $SW_2$; and, since the NAND gate now is conditioned, or enabled, this control pulse is passed to UP/DOWN counter 22 is increment (or decrement) the count thereof. Accordingly, the tuning condition of frequency synthesizer tuner 20 is changed once again. After a predetermined number (for example one) of control pulses are passed by NAND 38 to the UP/DOWN counter, flip-flop circuit 39 is reset to its second state to inhibit NAND gate 38 from passing further control pulses.

Thus, it is seen that the tuning condition of the frequency synthesizer tuner may be changed in a step-wise manner by this "rocking" of control knob 7. In the present example, it is assumed that the tuning condition is changed by 0.1 MHz when the tuner is operated in its FM mode, and by 1 KHz when the tuner is operated in its AM mode, in response to each successive rocking operation.

Figure 4A:
FIGS. 4A-4E are waveform diagrams which are useful in understanding the operation of the present invention.
Figure 4B:
Figure 4C:
Figure 4D:

Let it now be assumed that tuning knob 7 is rotated by more than 20° from its center position. Switch $SW_1$ thus is moved to its operative position whereby movable contact $M_1$ engages fixed contact $U_1$ or fixed contact $D_1$, depending upon the direction of rotation of the tuning knob. If resistor 33, included in astable multivibrator 32, is a fixed resistor, the astable multivibrator generates the pulse signal $S_1$ shown in FIG. 4A. The leading edge of this pulse signal $S_1$ triggers monostable multivibrator 34 to generate gating pulses $S_2$ of predetermined duration, as shown in FIG. 4B. Each of these gating pulses is supplied to NAND gate 35 to enable the NAND gate for the duration of the gating pulse. If movable contact $M_1$ engages its fixed contact $U_1$, control pulse signals $S_3$ are supplied via switch $SW_1$ to the other input of NAND gate 35, as shown in FIG. 4C. Those control pulse signals $S_3$ which are present during the duration of gating pulses $S_2$ are passed by NAND gate 35 as control pulses $S_4$ (FIG. 4D), and are supplied via NOR circuit 37 to UP/DOWN counter 22. In the illustrated example, it is assumed that each gating pulse $S_2$ has a duration which encompasses two control pulse signals, and thus the count of UP/DOWN counter 22 is incremented (or decremented) by these two control pulses. Alternatively, the duration of gating pulses $S_2$ may encompass any predetermined number of control pulses $S_3$, for example, one, two, three, etc. control pulses, in order to change the count of UP/DOWN counter 22 by a corresponding amount.

Figure 4E:

Resistor 33 is, of course, a variable resistor. Furthermore, the adjustment of this resistor is ganged for simultaneous operation with the rotation of tuning knob 7. Hence, when the tuning knob is rotated such that switch $SW_1$ is moved to its operative position, any further rotation of the tuning knob beyond 20° in the clockwise or counterclockwise direction effects a change in the resistance of variable resistor 33. This, in turn, changes the frequency, and thus the period, of pulses $S_1$, as shown in FIG. 4E. It is appreciated that, as the period of pulses $S_1$ changes, the period (but not the duration) of gating pulses $S_2$ likewise changes. Hence, the rate at which control pulse signals $S_3$ are gated, or passed, by NAND gate 35 as control pulses $S_4$ increases. Thus, it is seen that, as the period of the gating pulses increases, the rate at which the count of UP/DOWN counter 22 changes also increases. Accordingly, if tuning knob 7 is rotated in the clockwise or counterclockwise direction by more than 20° from its center position, the rate at which the tuning condition of frequency synthesizer tuner 20 changes is increased. This is because the count of UP/DOWN counter 22 changes at an increasing rate to correspondingly change the dividing ratio of programmable divider 21, and thus establish the tuning condition of the tuner. That is, the rotation of control knob 7 adjusts the speed at which the count of the UP/DOWN counter, and thus the dividing ratio of the programmable frequency divider, changes. The user of the illustrated apparatus may, therefore, vary the auto-scanning rate as desired.

Circuit 31 is adapted to provide an indication that the tuning condition of frequency synthesizer tuner 20 is changing. It now should be appreciated that the tuning condition is changed if the count of UP/DOWN counter 22 is changed. The UP/DOWN counter generates an output pulse $S_6$ whenever its count is charged to change the least significant digit of the frequency to which the tuner is tuned. That is, when the tuner is operated in its FM mode, a pulse signal $S_6$ is produced when the frequency to which the tuner is tuned is changed by 0.1 MHz. Similarly, when the tuner is operated in its AM mode, pulse signal $S_6$ is produced whenever the frequency to which the tuner is tuned is changed by 1 KHz. The presence of this pulse $S_6$ is used by circuit 31 to provide an indication of a change in the tuning condition.

Circuit 31 includes an AND circuit 45, differentiating circuits 46 and 47 and a piezoelectric element 42. AND circuit 45 is adapted to sense when a pulse signal $S_6$ is produced by UP/DOWN counter 22 and to produce a sense pulse in response thereto. The leading and trailing edges of this sense pulse are differentiated by differentiating circuits 46 and 47 and used to trigger piezoelectric element 42. When triggered, and piezoelectric element generates an audible sound, thus indicating that the tuning condition of tuner 20 is changed. It may be appreciated that other acoustic generators may be used in place of the piezoelectric element, such as a loudspeaker or other electro-acoustic transducers.

AND circuit 45 includes transistors $Q_2$ and $Q_3$ whose collector-emitter circuits are connected in series. A capacitor $C_2$ is connected in series with these collector-emitter circuits, this series circuit being connected between a source of operating potential +B and ground. The base electrode of transistor $Q_2$ is connected to an input terminal 43 to receive a timing pulse $S_5$ that is synchronized with the control pulse signals generated by pulse oscillator 36. Since the count of UP/DOWN counter 22 changes in synchronism with these control pulse signals, it is appreciated that the pulse signal $S_6$ and the timing pulse supplied to input terminal 43 are time-coincident.

The base electrode of transistor $Q_3$ is connected to an input terminal 44 which receives the pulse $S_6$ from UP/DOWN counter 22. This input terminal also is connected to the base electrode of a transistor $Q_5$ connected in common-emitter configuration. The collector of this electrode is connected to the base electrode of another transistor $Q_4$ which also is connected in common-either configuration. The junction defined by the collector and base electrodes of transistors $Q_5$ and $Q_4$ is connected to the junction defined by the emitter and collector electrodes of transistors $Q_2$ and $Q_3$. The collector electrode of transistor $Q_4$ is coupled to capacitor $C_2$.

Capacitor $C_2$ additionally is connected to the base electrode of transistor $Q_6$ which functions as a phase inverter. The collector electrode of this transistor is further connected to differentiating circuit 46, formed of capacitor $C_3$ and resistor $R_3$, and also to the base electrode of a transistor $Q_7$ which functions as a further phase inverter. The collector electrode of transistor $Q_7$ is coupled to differentiating circuit 47 formed of a capacitor $C_4$ and a resistor $R_4$. Rectifiers $D_1$ and $D_2$, each poled to pass negative-going pulses, couple differentiating circuits 46 and 47 to piezoelectric element 42.

Figure 5A:
FIGS. 5A-5F are waveform diagrams which are useful in understanding the operation of a tuning condition indicator which can be used with the present invention.
Figure 5B:

In operation, let it be assumed that the count of UP/DOWN counter is changed, and the UP/DOWN counter produces pulse signal $S_6$, shown in FIG. 5B. This pulse signal is supplied to the base electrode of transistor $Q_3$. Timing pulses $S_5$, shown in FIG. 5A, are periodic timing pulses and are supplied to the base electrode of transistor $Q_2$. As mentioned above, pulse signal $S_6$ is in time-coincidence with timing pulse $S_5$, as indicated in FIGS. 5A and 5B. Transistor $Q_2$ is rendered conductive by timing pulse $S_5$, and transistor $Q_3$ is rendered conductive by pulse signal $S_6$. When these transistors both are conductive, capacitor $C_2$ is rapidly charged by current flowing from source +B through the collector-emitter circuits of these series-connected transistors. The voltage across capacitor $C_2$ is shown as a pulse signal $S_7$ in FIG. 5C.

In addition to rendering transistor $Q_3$ conductive, pulse signal $S_6$ renders transistor $Q_5$ conductive. This, in turn, applies a relatively low potential to the base electrode of transistor $Q_4$ to maintain this transistor non-conductive. As will be described below, transistor $Q_4$ functions to discharge capacitor $C_2$. However, since this transistor now is non-conductive, capacitor $C_2$ is not discharged.

Figure 5C:
Figure 5D:
Figure 5E:
Figure 5F:

The signal $S_7$ across capacitor $C_2$ is inverted by transistor $Q_6$ to the negative-going pulse signal $S_8$, shown in FIG. 5D. Differentiating circuit 46 differentiates the leading edge of this negative-going pulse signal $S_8$ to supply a negative pulse to piezoelectric element 42. Inverted pulse $S_8$ is further phase-inverted by transistor $Q_7$, resulting in the positive-going pulse $S_9$, shown in FIG. 5E. The negative-going trailing edge of this pulse is differentiated by differentiating circuit 47 and passed via rectifier $D_2$ to piezoelectric element 42. Thus, the piezoelectric element is supplied with negative pulses $S_{10}$, shown in FIG. 5F, in response to the pulse $S_7$ which is produced across capacitor $C_2$ when the count of UP/DOWN counter 22 is changed.

At the next timing pulse $S_5$, it is assumed that the count of the UP/DOWN counter has not changed again. Thus, timing pulse $S_5$ now is not accompanied by a pulse signal $S_6$. In the absence of pulse signal $S_6$, only transistor $Q_2$ is rendered conductive. That is, transistor $Q_3$, as well as transistor $Q_5$, remains non-conductive. When transistor $Q_2$ is conductive, a relatively higher potential is supplied from source +B via the collector-emitter circuit of this transistor to the base electrode of transistor $Q_4$. This renders transistor $Q_4$ conductive to discharge capacitor $C_2$ and thus terminate pulse $S_7$, as shown in FIG. 5C. It is, of course, recognized that the termination of pulse $S_7$ results in the trailing edge which is differentated by differentiating circuit 47 and supplied by rectifier $D_2$ to piezoelectric element 42.

Negative pulses $S_{10}$ trigger the piezoelectric element to generate the audible sound, thereby indicating that the count of UP/DOWN counter 22 has been incremented or decremented. This change in the count of the counter produces a corresponding change in the dividing ratio of programmable divider 21 which, in turn, changes the tuning condition of frequency synthesizer tuner 20.

In the event that the count of UP/DOWN counter 22 is changed by a parallel BCD representation of the frequency to which tuner 20 is to be tuned, AND circuit 45, together with capacitor $C_2$, would not be necessary. However, in the aforedescribed embodiment, it is assumed that the count of the UP/DOWN counter is incremented in response to individual control pulses $S_4$ which are supplied thereto. AND circuit 45 thus is provided to sense when the count of the UP/DOWN counter has been changed by a predetermined amount. In the example described herein, this predetermined amount has been assumed to be the least significant digit (i.e., 0.1 MHz or 1 KHz) of the frequency to which tuner 20 may be tuned.

It may be appreciated that the count of UP/DOWN counter 22 is changed at a rate determined by the user in response to his rotation of tuning knob 7. The rate at which this count is changed is indicated by the audible sounds generated by piezoelectric element 42 and thus may be perceived by the user. This audible perception may be helpful in selecting the rate at which the tuning condition is varied.

In accordance with the foregoing discussion, it is appreciated that the rate at which tuner 20 may be tuned to different broadcast frequencies can be changed continuously during the auto-scan mode, and this rate may be increased or decreased as desired. Furthermore, the tuning condition of the tuner may be changed to higher or lower broadcast frequencies, depending upon whether tuning knob 7 is rotated in the clockwise or counterclockwise direction. Still further, since the tuning condition can be changed in an incremental stepwise manner by the user's control over switches $SW_2$ and $SW_3$, the tuner may be tuned accurately to any desired broadcast frequency.

While the present invention has been particularly shown and described with reference to a preferred embodiment, it should be readily apparent that various changes and modifications in form and details may be made without departing from the spirit and scope of the invention. For example, UP/DOWN counter 22 may be a multi-stage counter, or register, adapted to supply a binary count to programmable frequency divider 21. It is not necessary that the count of the UP/DOWN counter be a multi-digit BCD count that is supplied serially to the programmable frequency divider. Further, transistors $Q_6$ and $Q_7$ in circuit 31 may be replaced by a phase splitter circuit to provide positive-going and negative-going pulses to differentiating circuits 47 and 46, respectively. Also, AND circuit 45 may be replaced by other suitable circuitry for sensing when the count of UP/DOWN counter 22 has been changed and for generating a pulse in response to that change.

It is, therefore, intended that the appended claims be interpreted as including the foregoing as well as various other such changes and modifications.

What is claimed is:

1. Tuning control apparatus for use with a frequency synthesizer tuner of the type having a phaselocked loop including a reference oscillator, a variable frequency oscillator to produce a local oscillating signal, a programmable frequency divider coupled to the variable frequency oscillator for dividing the frequency of said local oscillating signal by a variable dividing ratio to produce a frequency-divided oscillating signal, a phase comparator for comparing the frequency-divided oscillating signal to the output of the reference oscillator to produce an error signal, and means for feeding back the error signal from the phase comparator to the variable frequency oscillator to adjust the frequency of the local oscillating signal and thereby establish a tuning condition of the tuner, said apparatus comprising counter means for counting control pulses supplied thereto, the count of said counter means determining the dividing ratio of said programmable frequency divider; control pulse generating means for supplying control pulses to said counter means; and adjusting means operable to adjust the rate at which said control pulses are supplied to said counter means for adjusting the speed at which the count of said counter means and the dividing ratio of said programmable frequency divider changes said adjusting means comprising gate pulse generating means for generating periodic gating pulses of substantially constant duration, means for controllably varying the period of said constant duration gating pulses; and gate means conditioned by said periodic gating pulses for gating a predetermined number of said control pulses to said counter means, the number of gated control pulses being determined by the duration of said gating pulses, and the rate at which said control pulses are gated being determined by the period of said gating pulses.

2. The apparatus of claim 1 wherein said counter means comprises UP/DOWN counting means; and wherein said control pulse generating means is operable to generate count-up and count-down pulses, and includes selector means for selecting either said count-up or said count-down pulses to be supplied to said gate means, whereby the count of said UP/DOWN counting means is incremented by said count-up pulses at the rate determined by said gating pulses and said count is decremented by said count-down pulses at said rate determined by said gating pulses.

3. The apparatus of claim 1 wherein said means for varying the period of said gating pulses comprises manually controllable means to enable an operator to adjust the speed at which said tuning condition of said tuner varies as desired.

4. The apparatus of claim 3 wherein said gate pulse generating means comprises astable multivibrator means; and said manually controllable means comprises manually adjustable resistance means for controlling the period of the pulses produced by said astable multivibrator means.

5. Tuning control apparatus for use with a frequency synthesizer tuner of the type having a phase-locked loop including a reference oscillator, a variable frequency oscillator to produce a local oscillating signal, a programmable frequency divider coupled to the variable frequency oscillator for dividing the frequency of said local oscillating signal by a variable dividing ratio to produce a frequency-divided oscillating signal, a phase comparator for comparing the frequency-divided oscillating signal to the output of the reference oscillator to produce an error signal, and means for feeding back the error signal from the phase comparator to the variable frequency oscillator to adjust the frequency of the local oscillating signal and thereby establish a tuning condition of the tuner, said apparatus comprising counter means for counting control pulses supplied thereto, the count of said counter means determining the dividing ratio of said programmable frequency divider; control pulse generating means for supplying control pulses to said counter means; astable multivibrator means for generating periodic pulses; manually adjustable resistance means for controlling the period of the pulses produced by said astable multivibrator means; monstable multivibrator means triggered by said astable multivibrator means to generate gate pulses of predetermined duration and of a period equal to the period of the pulses produced by said astable multivibrator means; and gate means conditioned by said gate pulses for gating said control pulses to said counter means, whereby the speed at which the count of said counter means and the dividing ratio of said programmable frequency divider changes is the rate determined by the period of said gate pulses.

6. Tuning control apparatus for use with a frequency synthesizer tuner of the type having a phase-locked loop including a reference oscillator, a variable frequency oscillator to produce a local oscillating signal, a programmable frequency divider coupled to the variable frequency oscillator for dividing the frequency of said local oscillating signal by a variable dividing ratio to produce a frequency-divided oscillating signal, a phase comparator for comparing the frequency-divided oscillating signal to the output of the reference oscillator to produce an error signal, and means for feeding back the error signal from the phase comparator to the variable frequency oscillator to adjust the frequency of the local oscillating signal and thereby establish a tuning condition of the tuner, said apparatus comprising UP/DOWN counting means; a pulse oscillator for generating count-up and count-down pulses in quadrature phase relationship with each other, and first and second outputs provided with said count-up and count-down pulses, respectively; gate pulse generating means for generating periodic gating pulses; means for controllably varying the period of said gating pulses; gate means conditioned by said periodic gating pulses for selectively gating said count-up and count-down pulses to said UP/DOWN counting means; and selector means for selecting either said count-up or said count-down pulses to be supplied to said gate means, whereby the count of said UP/DOWN counting means is incremented by said count-up pulses at the rate determined by said gating pulses and said count is decremented by said count-down pulses at said rate determined by said gating pulses, the count of said UP/DOWN counting means determining the dividing ratio of said programmable frequency divider.

7. The apparatus of claim 6 wherein said selector means comprises manually operable switch means coupled to said first and second outputs of said pulse oscillator for connecting either said first output or said second output to said gate means.

8. The apparatus of claim 7 wherein said means for varying the period of said gating pulses comprises manually controllable means ganged for simultaneous operation with said manually operable switch means, such that the period of the selected count-up or count-down pulses is varied with continued operation of said manually operable switch means.

9. Tuning control apparatus for use with a frequency synthesizer tuner of the type having a phase-locked loop including a reference oscillator, a variable frequency oscillator to produce a local oscillating signal, a programmable frequency divider coupled to the variable frequency oscillator for dividing the frequency of said local oscillating signal by a variable dividing ratio to produce a frequency-divided oscillating signal, a phase comparator for comparing the frequency-divided oscillating signal to the output of the reference oscillator to produce an error signal, and means for feeding back the error signal from the phase comparator to the variable frequency oscillator to adjust the frequency of the local oscillating signal and thereby establish a tuning condition of the tuner, said apparatus comprising counter means for counting control pulses supplied thereto, the count of said counter means determining the dividing ratio of said programmable frequency divider; a pulse oscillator for generating a train of control pulses; gate means selectively enabled to couple said control pulses to said counter means; switch means having an operative state to supply said control pulses to said gate means and an inoperative state; and gate control means for supplying an enabling signal to said gate means and for terminating said enabling signal at a predetermined time after said switch means changes over from said operative state to said inoperative state, whereby said gate means is enabled to couple only a predetermined number of said control pulses to said counter means.

10. The apparatus of claim 9 wherein said gate control means comprises bistate means operable to assume a first state at a predetermined time following the operation of said switch means to its operative state for disabling said gate means from passing control pulses, said bistate means being operable to assume a second state when said switch means is operated to its inoperative state for enabling said gate means to pass control pulses; and circuit means for supplying said control pulses to said gate means when said switch means is in its operative position.

11. Tuning control apparatus for use with a frequency synthesizer tuner of the type having a phase-locked loop including a reference oscillator, a variable frequency oscillator to produce a local oscillating signal, a programmable frequency divider coupled to the variable frequency oscillator for dividing the frequency of said local oscillating signal by a variable dividing ratio to produce a frequency-divided oscillating signal, a phase comparator for comparing the frequency-divided oscillating signal to the output of the reference oscillator to produce an error signal, and means for feeding back the error signal from the phase comparator to the variable frequency oscillator to adjust the frequency of the local oscillating signal and thereby establish a tuning condition of the tuner, said apparatus comprising counter means for counting control pulses supplied thereto, the count of said counter means determining the dividing ratio of said programmable frequency divider; a pulse oscillator for generating a train of control pulses; gate means normally conditioned to pass said control pulses to said counter means; manually operable switch means having operative and inoperative positions; a flip-flop circuit operable to assume a first state at a predetermined time following the operation of said manually operable switch means to its operative position for disabling said gate means from passing control pulses, said flip-flop circuit being operable to assume a second state when said manually operable switch means is operated to its inoperative position for enabling said gate means to pass control pulses; a delay circuit coupled between said manually operable switch means and an input of said flip-flop circuit for delaying a control pulse supplied to said flip-flop circuit to actuate the same to the first state thereof so that only a predetermined number of control pulses is passed to said counter means during the delay that said flip-flop circuit is actuated to said first state thereof; and circuit means for supplying said control pulses to said gate means when said manually operable switch means is in its operative position.

12. The apparatus of claim 11 wherein said manually operable switch means comprises a first switch selectively operable to connect said pulse oscillator to said delay circuit and to said gate means, whereby said gate means passes said predetermined number of control pulses and then is disabled; and a second switch selectively operable to actuate said flip-flop circuit to the second state thereof, said first and second switches being operative concurrently such that said second switch actuates said flip-flop circuit to said second state when said first switch disconnects said pulse oscillator from said delay circuit and said gate means, and said first switch connects said pulse oscillator to said delay circuit and said gate means when said second switch is not operated.

13. The apparatus of claim 12 wherein said counter means comprises UP/DOWN counting means; wherein said pulse oscillator includes first and second outputs whereat count-up and count-down pulses are provided, respectively; and wherein said first switch is a changeover switch to connect either said first or said second output to said gate means, whereby the count of said UP/DOWN counting means is incremented or decremented by said predetermined number of control pulses.

14. Tuning control apparatus for use with a frequency synthesizer of the type having a phase-locked loop including a reference osicllator, a variable frequency oscillator to produce a local oscillating signal, a programmable frequency divided coupled to the variable frequency oscillator for dividing the frequency of said local oscillating signal by a variable dividing ratio to produce a frequency-divided oscillating signal, a phase comparator for comparing the frequency-divided oscillating signal to the output of the reference oscillator to produce an error signal, and means for feeding back the error signal from the phase comparator to the variable frequency oscillator to adjust the frequency of the local oscillating signal and thereby establish a tuning condition of the tuner, said apparatus comprising counter means for counting control pulses supplied thereto, the count of said counter means determining the dividing ratio of said programmable frequency divider; a pulse oscillator for generating a train of control pulses; first gate means selectively supplied with said control pulses and operative to pass said control pulses to said counter means; adjusting means operable to supply a periodic gating pulse of adjustable period to said first gate means to enable the latter to pass said supplied control pulses during each gating pulse duration and thereby control the speed at which the count of said counter means and the dividing ratio of said programmable frequency divider changes; first switch means for selectively supplying said control pulses to said first gate means; second gate means selectively supplied with said control pulses to pass a predetermined number thereof to said counter means; and second switch means operative mutually exclusively of said first switch means to enable said second gate means to pass only a predetermined number of said supplied control pulses.

15. The apparatus of claim 14 wherein said first and second switch means comprise a manually operable switching device having at least a first and a second movable contact, said first and second movable contacts being ganged for simultaneous operation, and said first movable contact being movable to an operative position to supply said control pulses to said first gate means and said second movable contact being movable to an operative position when said first movable contact is in an inoperative position to enable said second gate means to pass said predetermined number of control pulses.

16. The apparatus of claim 15 wherein said manually operable switching device comprises a rotary switch having first and second fixed contact portions engageable by said first and second movable contacts, respectively; said second fixed contact portion being engaged by said second movable contact if said rotary switch is rotated beyond a first angular amount, and said first fixed contact portion being engaged by said first movable contact if said rotary switch is further rotated beyond a second angular amount.

17. The apparatus of claim 15 or 16 wherein said second gate means comprises a coincidence gate having one input connected to receive said control pulses when said second movable contact is in its operative position and another input connected to receive an enabling signal; and a flip-flop circuit having a first state for supplying said enabling signal to said coincidence gate and a second state for supplying an inhibit signal thereto, said flip-flop circuit being set to said first state thereof when said second movable contact is moved from its operative position to its inoperative position and said flip-flop circuit being reset to said second state thereof at a predetermined time following the moving of said second movable contact to its operative position.

18. The apparatus of claim 17 wherein said second gate means further comprises a delay circuit coupled between said second movable contact and said flip-flop circuit for receiving a control pulse when said second movable contact is moved to its operative position for supplying a delayed reset signal to said flip-flop circuit to reset the latter to said second state thereof.

19. The apparatus of claim 18 wherein said second switch means further comprises another movable contact ganged for simultaneous operation with said second movable contact to set said flip-flop circuit to said first state thereof when said second movable contact is moved from its operative position to its inoperative position.

20. The apparatus of claim 15 or 16 wherein said first gate means comprises a NAND gate having one input connected to receive said control pulses when said first movable contact is in its operative position and another input connected to receive a gating signal; and said adjusting means comprises an astable multivibrator for generating periodic pulses, said astable multivibrator having a controllable element ganged for simultaneous operation with said first movable contact to vary the period of said generated pulses, and a monostable multivibrator coupled to said astable multivibrator and triggered by said pulses to produce gating pulses of predetermined duration and of a period determined by said controllable element.

21. The apparatus of claim 16 wherein said counter means comprises UP/DOWN counting means, said pulse oscillator is provided with first and second outputs for supplying count-up and count-down control pulses, respectively, and said rotary switch is bidirectionally rotatable, said first and second fixed contact portions each being comprised of a pair of fixed contacts individually engageable by said first and second movable contacts and connected to said first and second outputs, respectively, of said pulse oscillator for receiving said count-up and count-down control pulses, whereby said first and second gate means are supplied with count-up or count-down control pulses in accordance with the direction of rotation of said rotary switch to increment or decrement the count of said UP/DOWN counting means.

22. Tuning control apparatus for use with a frequency synthesizer tuner of the type having a phase-locked loop including a reference oscillator, a variable frequency oscillator to produce a local oscillating signal, a programmable frequency divider coupled to the variable frequency oscillator for dividing the frequency of said local oscillating signal by a variable dividing ratio to produce a frequency-divided oscillating signal, a phase comparator for comparing the frequency-divided oscillating signal to the output of the reference oscillating signal to produce an error signal, and means for feeding back the error signal from the phase comparator to the variable frequency oscillator to adjust the frequency of the local oscillating signal and thereby establish a tuning condition of the tuner, said apparatus comprising counter means for counting control pulses supplied thereto, the count of said counter means determining the dividing ratio of said programmable frequency divider; and control pulse generating means for supplying control pulses to said counter means, said control pulse generating means comprising a rotary tuning knob, a source of control pulses, and means responsive to the angular rotation of said rotary tuning knob to supply only a predetermined number of said control pulses to said counter means when said tuning knob is rotated within a first angular range and to supply control pulses continually to said counter means when said tuning knob is rotated beyond said first angular range.

23. The apparatus of claim 22, further comprising adjusting means operable to adjust the repetition rate at which said control pulses are supplied continually to said counter means when said tuning knob is rotated beyond said first angular range.

* * * * *